(12) United States Patent
Lang et al.

(10) Patent No.: US 11,500,588 B2
(45) Date of Patent: *Nov. 15, 2022

(54) ADJUSTING READ VOLTAGE LEVELS BASED ON A TEMPERATURE-DEPENDENT SLOPE OF THE THRESHOLD VOLTAGE DRIFT OF A MEMORY SUB-SYSTEM

(71) Applicant: Micron Technology, Inc., Boise, ID (US)

(72) Inventors: Murong Lang, San Jose, CA (US); Zhenming Zhou, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 16 days.

This patent is subject to a terminal disclaimer.

(21) Appl. No.: 17/147,126

(22) Filed: Jan. 12, 2021

(65) Prior Publication Data

US 2021/0132867 A1 May 6, 2021

Related U.S. Application Data

(63) Continuation of application No. 16/552,181, filed on Aug. 27, 2019, now Pat. No. 10,908,845.

(51) Int. Cl.
*G06F 12/00* (2006.01)
*G06F 3/06* (2006.01)
*G11C 7/22* (2006.01)

(52) U.S. Cl.
CPC .......... *G06F 3/0659* (2013.01); *G06F 3/0604* (2013.01); *G06F 3/0679* (2013.01); *G11C 7/22* (2013.01)

(58) Field of Classification Search
CPC .... G06F 3/0659; G06F 3/0604; G06F 3/0679; G11C 16/26; G11C 29/021; G11C 29/028; G11C 29/52; G11C 7/04; G11C 5/147; G11C 16/10; G11C 16/3418
See application file for complete search history.

(56) References Cited

U.S. PATENT DOCUMENTS

| | | | |
|---|---|---|---|
| 9,244,763 B1 | 1/2016 | Kankani et al. | |
| 9,384,846 B1 * | 7/2016 | Shim | G11C 7/04 |
| 9,666,249 B1 * | 5/2017 | Park | G11C 13/0069 |
| 9,898,218 B2 | 2/2018 | Healy et al. | |
| 10,446,254 B1 | 10/2019 | Zehavi et al. | |
| 2010/0073069 A1 | 3/2010 | Wang et al. | |
| 2013/0159796 A1 * | 6/2013 | Bedeschi | G06F 11/1048 714/708 |
| 2014/0281119 A1 | 9/2014 | Hyun et al. | |
| 2015/0194191 A1 * | 7/2015 | Luthra | G11C 13/0002 365/191 |
| 2016/0172051 A1 * | 6/2016 | Liang | G11C 11/5628 365/185.03 |

(Continued)

*Primary Examiner* — John A Lane
(74) *Attorney, Agent, or Firm* — Lowenstein Sandler LLP

(57) ABSTRACT

A data structure is stored that includes a slope value corresponding to each die temperature of a set of die temperatures, where the slope value represents a change of a read voltage level as a function of a delay time of a memory sub-system. Using the data structure, a stored slope value corresponding to a measured die temperature is identified. An adjusted read voltage level is determined based at least in part on the stored slope value. The read command is executed using the adjusted read voltage level.

20 Claims, 7 Drawing Sheets

(56) References Cited

U.S. PATENT DOCUMENTS

| | | |
|---|---|---|
| 2017/0200492 A1* | 7/2017 | Yang .................. G11C 7/04 |
| 2017/0255403 A1 | 9/2017 | Sharon et al. |
| 2018/0061504 A1* | 3/2018 | Kim .................. G11C 16/16 |
| 2019/0198096 A1 | 6/2019 | Mirichigni et al. |
| 2019/0278510 A1 | 9/2019 | Kaynak et al. |
| 2019/0391759 A1* | 12/2019 | Kang .............. G11C 13/0069 |
| 2020/0027503 A1 | 1/2020 | Chen et al. |
| 2020/0073451 A1 | 3/2020 | Nowell et al. |

* cited by examiner

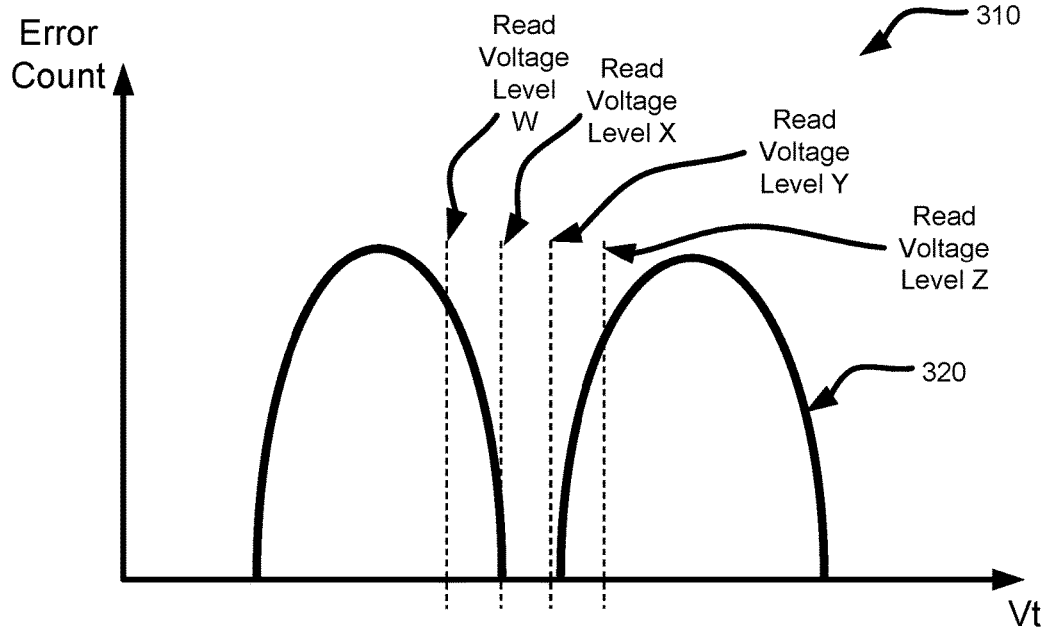
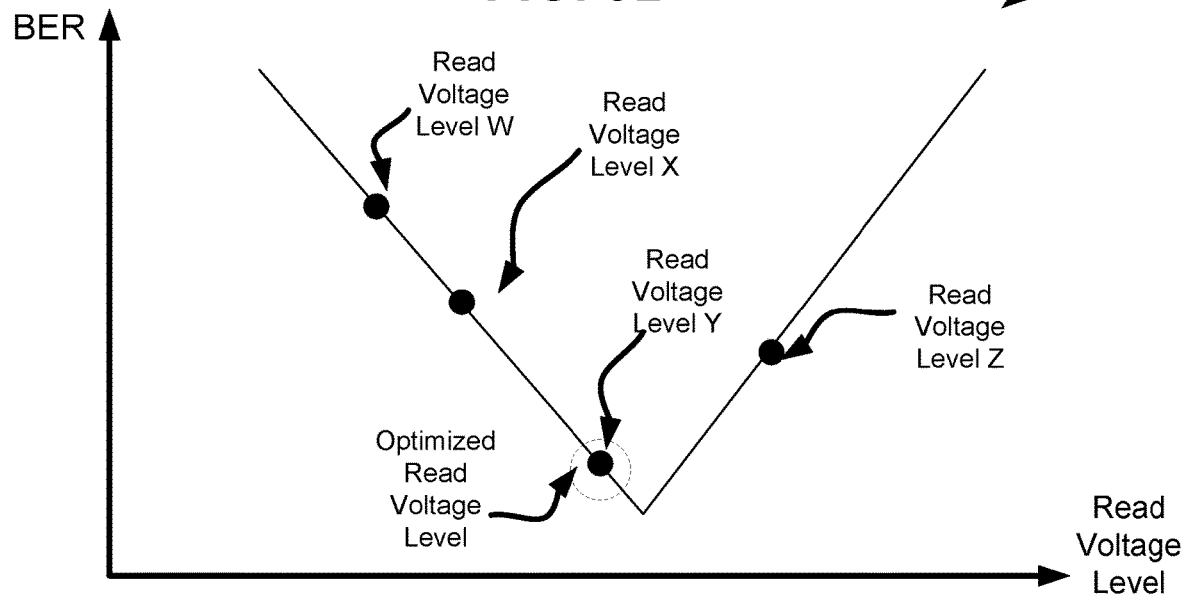

ADJUSTING READ VOLTAGE LEVELS BASED ON A TEMPERATURE-DEPENDENT SLOPE OF THE THRESHOLD VOLTAGE DRIFT OF A MEMORY SUB-SYSTEM

CROSS-REFERENCE TO RELATED APPLICATION

This application is a continuation of U.S. patent application Ser. No. 16/552,181, filed on Aug. 27, 2019, the entirety of which is hereby incorporated by reference herein.

TECHNICAL FIELD

Embodiments of the disclosure relate generally to memory sub-systems, and more specifically, relate to managing threshold voltage drift based on a temperature-dependent slope of the threshold voltage drift a memory sub-system.

BACKGROUND

A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

FIGS. 3A and 3B illustrate graphs including an example determination of a read voltage level corresponding to a lowest bit error rate in accordance with some embodiments.

DETAILED DESCRIPTION

Figure 1:
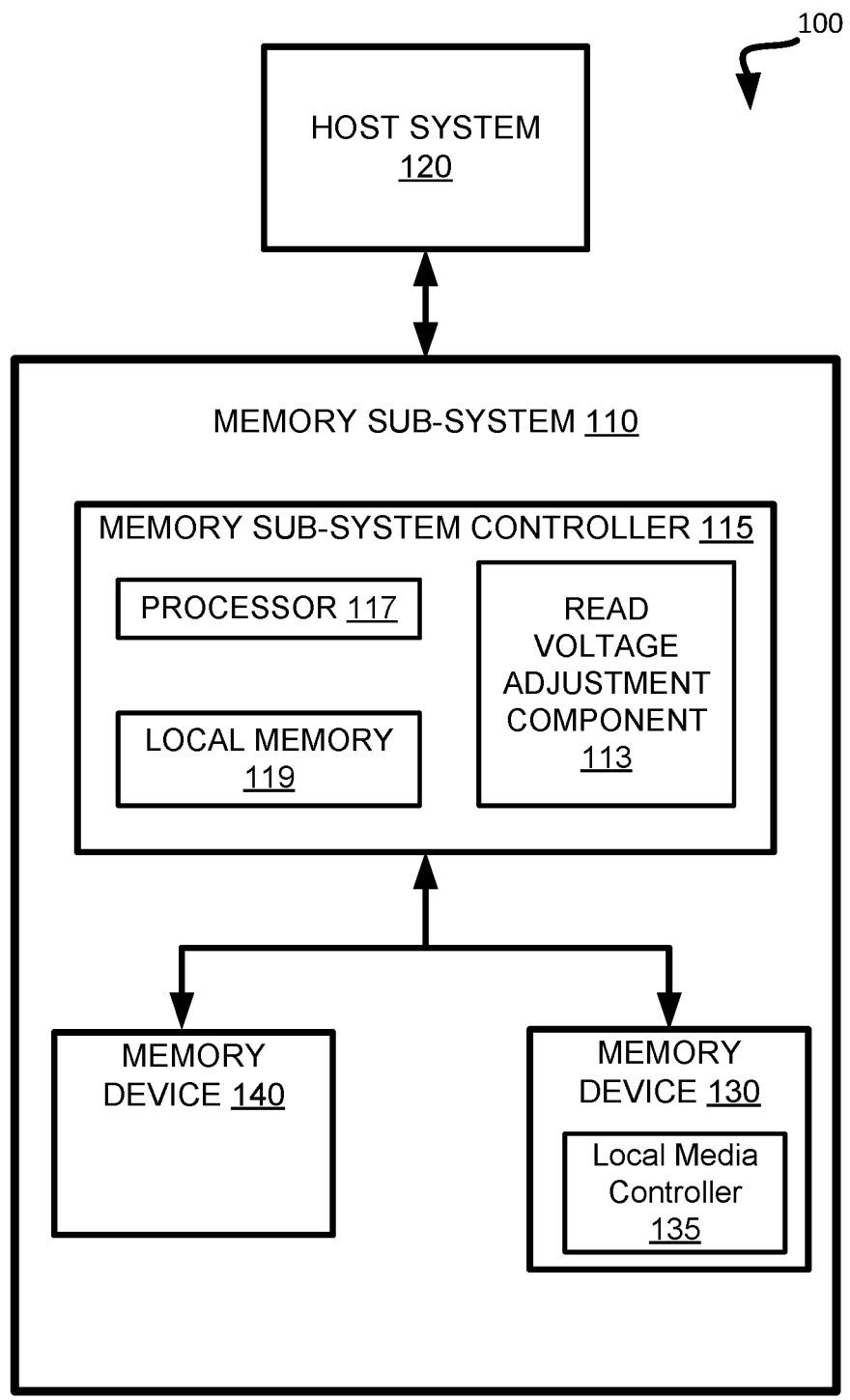
FIG. 1 illustrates an example computing environment that includes a memory sub-system in accordance with some embodiments of the present disclosure.

Aspects of the present disclosure are directed to managing threshold voltage drift based on a temperature-dependent slope of the threshold voltage drift a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

The memory devices can be non-volatile memory devices, such as three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1.

Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values. For example, a single level cell (SLC) can store one bit of information and has two logic states. The various logic states have corresponding threshold voltage levels. A threshold voltage (Vt) is the voltage applied to the cell circuitry (e.g., control gate at which a transistor becomes conductive) to set the state of the cell. A cell is set to one of its logic states based on the Vt that is applied to the cell. For example, if a high Vt is applied to an SLC, a charge will be present in the cell, setting the SLC to store a logic 0. If a low Vt is applied to the SLC, charge will be absent in the cell, setting the SLC to store a logic 1.

For certain memory types (i.e., for memory sub-systems employing certain types of storage media), error rates can vary over time. In particular, some non-volatile memories have threshold voltage programming distributions that move or "drift" higher over time. At a given read voltage level (i.e., a value of the voltage applied to a memory cell as part of a read operation), if the threshold voltage programming distributions move, then certain reliability statistics can also be affected. One example of a reliability statistic is a bit error rate (BER). The BER can be defined as the ratio of the number of erroneous bits to the number of all data bits stored in a unit of the memory sub-system, where the unit can be the entire memory sub-system, a die of memory device, a collection of codewords, or any other meaningful portion of the memory sub-system.

A read operation can be performed with a read voltage level. The read threshold voltage level or value (herein the "read voltage level") can be a particular voltage that is applied to memory cells of a memory device to read the data stored at the memory cells. For example, if a threshold voltage of a particular memory cell is identified as being below the read voltage level that is applied to the particular memory cell, then the data stored at the particular memory cell can be a particular value (e.g., '1') and if the threshold voltage of the particular memory cell is identified as being above the read voltage level, then the data stored at the particular memory cell can be another value (e.g., '0'). Thus, the read voltage level can be applied to memory cells to determine values stored at the memory cells.

In a conventional memory sub-system, when the threshold voltage programming distributions of a memory cell drift (also referred to as "threshold voltage drift"), the application of the read voltage level can be inaccurate relative to the changed threshold voltage. For example, a memory cell can be programmed to have a threshold voltage below the read voltage level. The programmed threshold voltage can change over time and can shift to be above the read voltage level. For example, the threshold voltage of the memory cell can shift from initially being below the read voltage level to being above the read voltage level. As a result, when the read voltage level is applied to the memory cell, the data stored at the memory cell can be misread or misinterpreted to be at an incorrect value as compared to the value as originally stored when the threshold voltage had not yet shifted.

The speed or rate of the drift of the threshold voltage programming distributions and corresponding BER of a conventional memory sub-system can be affected by one or more operating characteristics of the memory sub-system, such as die temperature and write-to-read (W2R) delay time. The W2R delay time can refer to a period of time that passes between when data is written to a unit of the memory device and when the data is read from the unit of the memory device.

For example, the drift speed is faster at higher die temperatures than at lower temperatures when experiencing a same W2R delay time. Furthermore, voltage drift causes an increase in read retry trigger rate (e.g., a rate of errors (bits/time) that trigger error correction processing). In another example, longer W2R delay times produce greater threshold voltage drifts as compared to shorter W2R delay times. In this example, the read retry trigger rate is higher for longer W2R delay times than it is for shorter W2R delay times. As a result, if a default or static read voltage level is applied for long W2R delay times, the read retry trigger rate is high, which significantly degrades memory sub-system performance.

Conventional memory sub-systems employ a read scrub operation (e.g., a three hour read scrub where an entire memory sub-system is read once every three hours) and a write scrub operation (i.e., a write operation that forces toggling between a '0' value to a '1' value and vice versa on a periodic basis, such as every twelve hours) to refresh or push the threshold voltage programming distributions down to combat the drift. However, the read and write scrub operations degrade the quality of service of the memory sub-system due to the frequent performance of read operations and results and unnecessary read disturb which reduces reliability.

Aspects of the present disclosure address the above and other deficiencies by having a memory sub-system that determines an adjusted read voltage level based on a slope value corresponding to a die temperature and a W2R delay time to minimize a bit error rate corresponding to a threshold voltage programming distribution experiencing drift. In particular, the adjusted read voltage level can be determined as a function of the W2R delay time and a slope value for multiple different die temperatures, where each slope value represents a change of optimized read voltage values at each particular die temperature The optimized read voltage values for each die temperature can be determined by identifying a read voltage level corresponding to a decreased bit error rate at multiple different W2R delay times.

Advantages of the present disclosure include, but are not limited to, a decrease in the error rate of the memory sub-system. Furthermore, an adjusted read voltage level can be determined and applied in connection with a read operation to counteract threshold voltage drift caused by die temperatures and W2R delay times. In addition, the execution of a read command using the adjusted read voltage level corresponding to a temperature-dependent slope representing a change of optimized read voltage levels (e.g., optimized to a decreased relative bit error rate) and a current W2R delay time counteracts threshold voltage drift caused by the die temperature and W2R delay time. The adjustment of the read threshold voltage as a function of the temperature-dependent slope and W2R delay time reduces read-retry trigger rate and improves the performance of the memory sub-system due to improved data integrity. Advantageously, the present disclosure reduces or eliminates the read scrub frequency and avoids unnecessary read disturb errors.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access memory components, such as memory devices 130, when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory devices such as 3D cross-point type and NAND type memory are described, the memory device 130 can be based on any other type of non-volatile memory, such as read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address, namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a read voltage adjustment component 113 that can be used to determine an adjusted read threshold value corresponding to a temperature-dependent slope representing changes to read voltage levels (e.g., read voltage levels that are optimized to decrease or reduce bit error rates) and a write-to-read delay time and apply the adjusted read threshold value in executing a read operation relating to data stored at the memory sub-system 110. In some embodiments, the read voltage levels that are used to determine the slope value are associated with decreased bit error rates and are referred to as "optimized read voltage levels." In some embodiments, the controller 115 includes at least a portion of the read voltage adjustment component 113. For example, the controller 115 can include a processor 117 (processing device) configured to execute instructions stored in local memory 119 for performing the operations described herein. In some embodiments, the read voltage adjustment component 113 is part of the host system 120, an application, or an operating system. In the same or alternative embodiments, portions of the read voltage adjustment component 113 are part of the host system 120 while other portions of the read voltage adjustment component 113 are performed at the controller 115.

The read voltage adjustment component 113 can be used to store a data structure (e.g. a table) including temperature-dependent slope values representing a change or delta of optimized read voltage levels as a function of the W2R delay times of the memory sub-system 110. In an embodiment, the read voltage adjustment component 113 identifies a default read voltage level (e.g., a probe is executed at a predetermined W2R delay time (e.g., a low delay time such as 25 μs) and stored in a memory associated with the memory sub-system 110 (e.g., a FuseRom memory). The read voltage adjustment component 113 further determines a set of optimized read voltage levels associated with each die temperature of a set of die temperatures (e.g., 0° Celsius (C), 25° C., 50° C., and 85° C.), where each optimized read voltage level of the set of optimized read voltage levels is determined at a corresponding W2R delay time (e.g., a W2R delay time of 25 microsecond (μs), 1 millisecond (ms), 1 second (s), 1 minute (min), 1 hour (hr) and 10 hrs). Using the set of optimized read voltage levels for each die temperature, a value of a slope (i.e., a temperature-dependent slope) representing a change or delta of the optimized read voltage levels is determined. In an embodiment, the slope value is determined as a function of the W2R delay time. In an embodiment, a slope value is calculated for each of the set of die temperatures and stored in a data structure (e.g., a look-up table).

During operation of the memory sub-system, the read voltage adjustment component 113 determines a current die temperature and uses the data structure to identify the slope value associated with the current die temperature. In view of the read command, a current W2R delay time is determined. The read voltage adjustment component 113 then determines an adjusted read voltage level based on the default read voltage level, the identified slope value (which is based on the current die temperature), and the current W2R delay time. To counteract threshold voltage drift due to temperature and W2R delay time changes, the read voltage adjustment component 113 executes the read command using the adjusted read voltage level. Further details with regards to the operations of the read voltage adjustment component 113 are described below.

Figure 2:
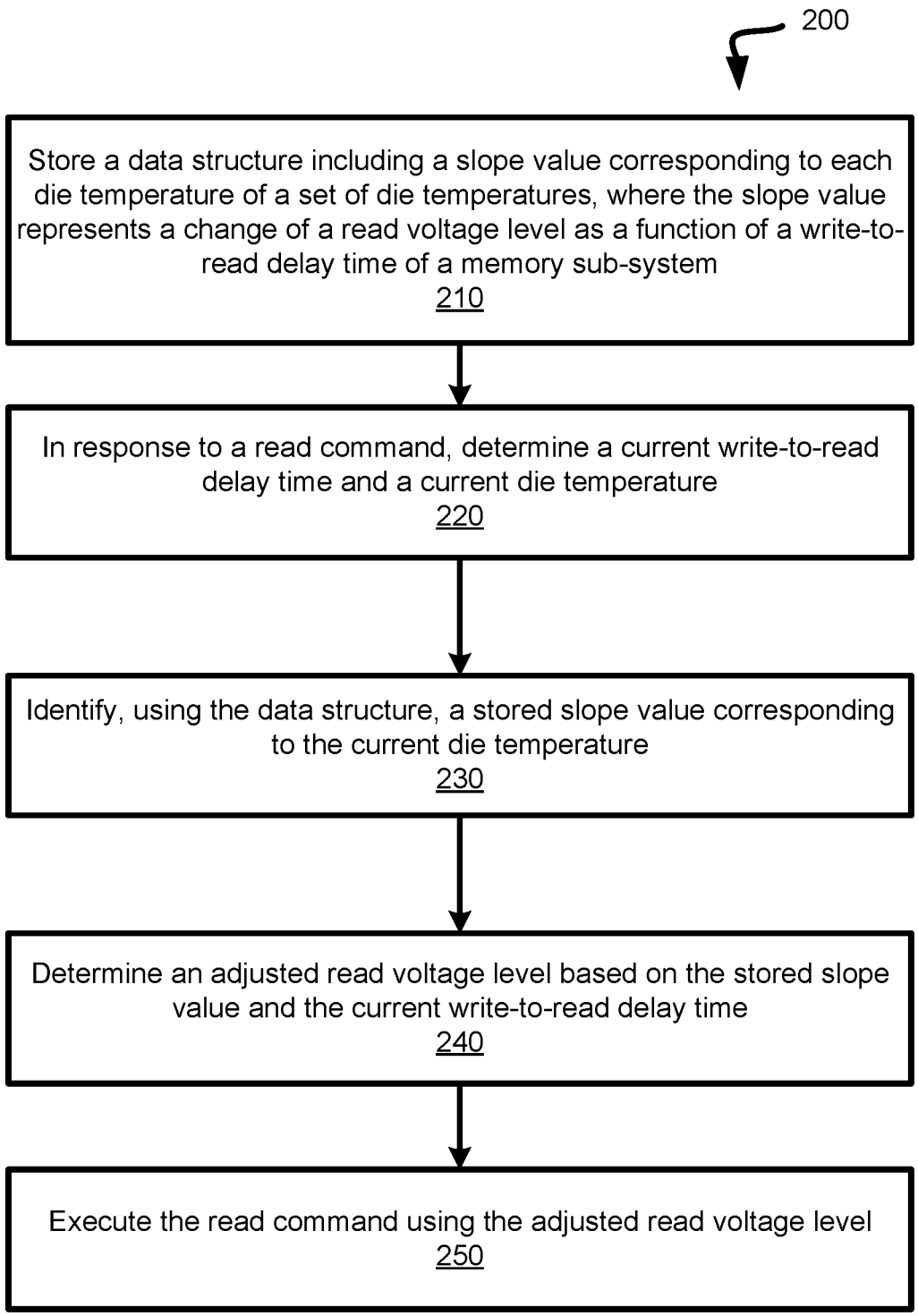
FIG. 2 is a flow diagram of an example method to execute a read command using an adjusted read voltage level corresponding to a temperature-dependent slope value representing a change in read voltage levels as a function of write-to-read delay times in accordance with some embodiments.

FIG. 2 is a process flow diagram of an example method 200 to execute a read command using an adjusted read voltage level in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, at operation 210, the processing logic stores a data structure including a slope value corresponding to each die temperature of a set of die temperatures, where the slope value represents a change of a read voltage level as a function of a write-to-read delay time of a memory sub-system. In an embodiment, the data structure (e.g., a table) is stored in a data store (e.g., a fuse ROM of the memory sub-system) operatively coupled to the read voltage adjustment component 113 of FIG. 1. In an embodiment, the data structure identifies a slope value representing a change in read voltage levels (e.g., read voltage levels that have been "optimized" to correspond with a decreased bit error rate) for each different temperature, and as such, is a temperature-dependent slope value.

In an embodiment, for each of the die temperatures of the set of die temperatures, the processing logic determines the slope value representing the change of the read voltage level as a function of the write-to-read delay time. In an embodiment, the set of die temperatures can include any number of different die temperatures ranging from a low die temperature and a high die temperature. For example, the set of die temperatures can include temperatures of 0° C., 25° C., 50° C., and 85° C. It is noted that any suitable temperatures can be selected for use in determining a corresponding temperature-dependent slope value. In an embodiment, the slope value can be determined according to the following expression:

$$\text{Slope} = \text{Delta}(\text{Read Voltage Level}) / \log(W2R \text{ delay time}),$$

where the Delta(Read Voltage Level) represents a delta or change of a set of optimized read voltage levels corresponding to different W2R delay times at the given temperature (e.g., a set of multiple different optimized read voltage levels changing as a function of the different W2R delay times are determined for each temperature). Examples of the different W2R delay times can include 25 μs, 1 ms, 1 s, 1 min, 1 hr and 10 hrs. An optimized read voltage level can be determined for each of the different delay times, at each temperature level. Example methods for determining the set of optimized read voltage levels and the slope value corresponding to the change in the optimized read voltage levels for various temperatures is described below in connection with the graphs of FIGS. 3A, 3B, and 4.

FIG. 3A illustrates a graph 310 showing a threshold voltage for a programming distribution 320 associated with a memory sub-system with a corresponding error count for a given die temperature and a given W2R delay time. As shown in FIG. 3A, various read voltage levels (e.g., read voltage level W, read voltage level X, read voltage level Y, and read voltage level Z) are measured for the given W2R delay time. In an embodiment, the set of different read voltage levels that are measured can include a baseline read voltage level (e.g., read voltage level Y in FIG. 3A) and a range of other values that are plus or minus 50-200 mV relative to the baseline value.

FIG. 3B illustrates a graph of a bit error rate corresponding to the read voltage levels. As shown in FIG. 3B, a plot of the bit error values corresponding to the measured read voltage levels (e.g., read voltage level W, read voltage level X, read voltage level Y, and read voltage level Z) can be used to identified the read voltage level having a decreased bit error rate (e.g., a lowest relative bit error rate). In the example shown in FIG. 3B, the read voltage level Y has the lowest relative bit error rate among the measured bit error rates and is identified as the optimized read voltage level corresponding to the selected die temperature and W2R delay time. In an embodiment, a read voltage level (e.g., an optimized read voltage level corresponding to a decreased bit error rate) is identified for each die temperature of a set of die temperatures) at each W2R delay time of a set of W2R delay times.

Figure 4:
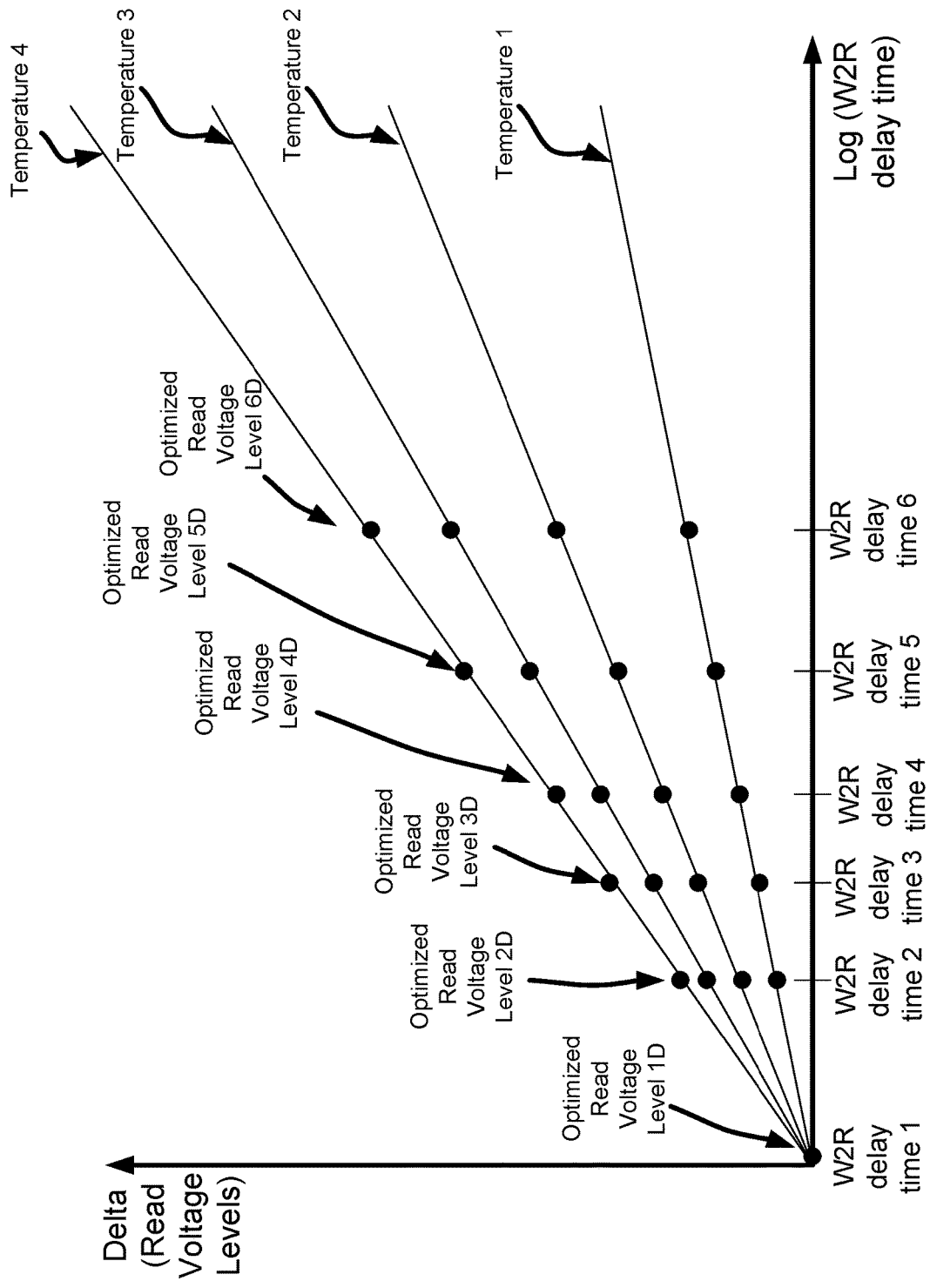
FIG. 4 illustrates a graph including an example plot of a delta of read voltage levels and write-to-read delay times to determine slope values corresponding to multiple different die temperatures in accordance with some embodiments.

FIG. 4 illustrates a graph showing a change or delta of read voltage levels as a function of the W2R delay times for a set of different temperatures. As shown in FIG. 4, the read voltage levels (e.g., the optimized read voltage levels, as described in connection with FIGS. 3A and 3B) are plotted against a logarithmic function (log) of the W2R delay times (e.g., W2R delay time 1 through W2R delay time 6) are plotted for each of the different die temperatures (e.g., Temperature 1 through Temperature 4). In one example shown in FIG. 4, the delta of optimized read voltage levels 1D, 2D, 3D, 4D, 5D, and 6D is shown for a Temperature 4. In an embodiment, the slope value is determined for Temperature 4 as a function of the Delta (Read Voltage Level) and the log of the W2R delay time. In an embodiment, a temperature-dependent slope value can be determined using the graph shown in FIG. 4 for each temperature of the set of different temperatures.

Figure 5:
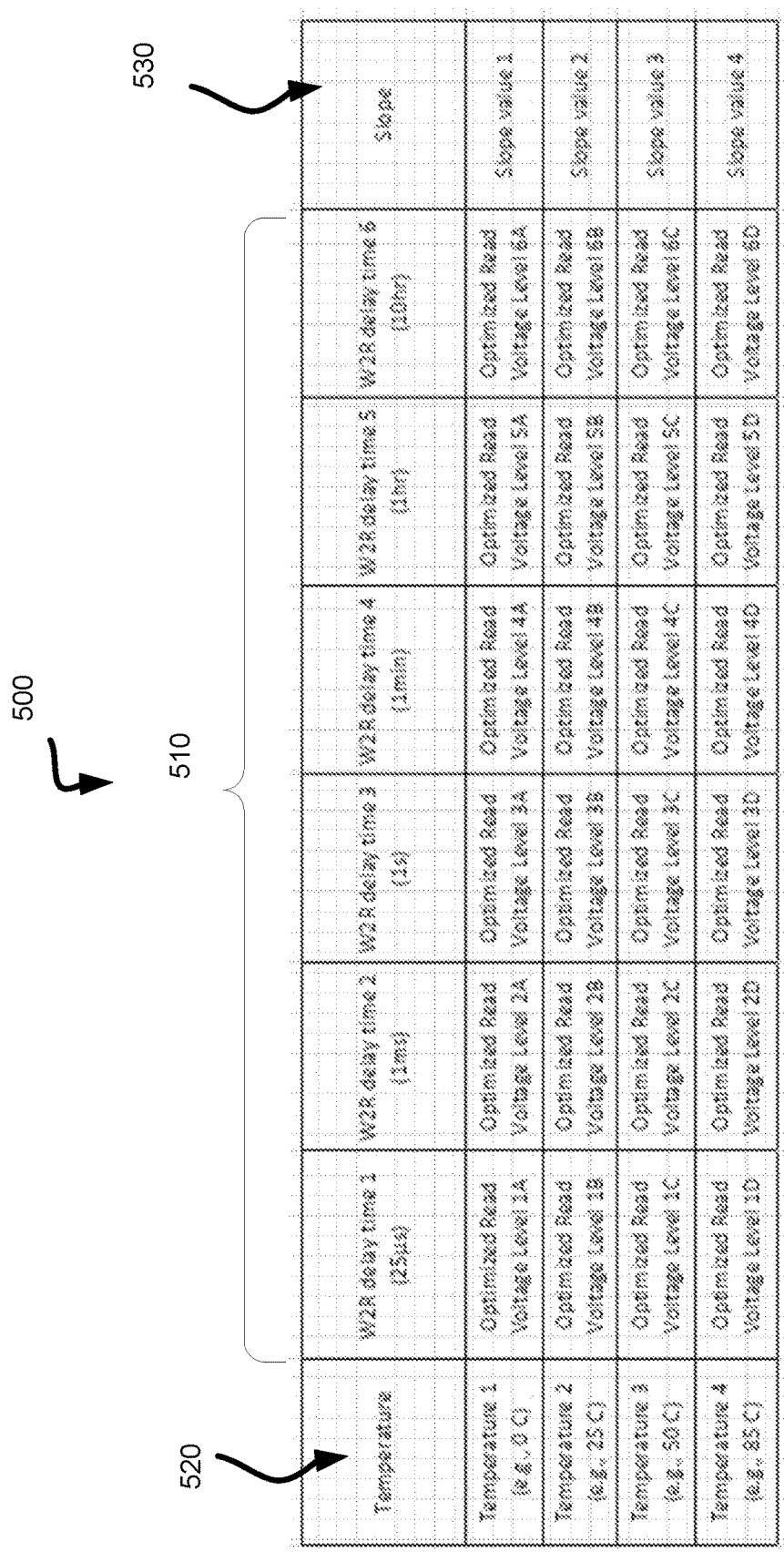
FIG. 5 illustrates an example data structure including a stored association between multiple different die temperatures and a corresponding slope value in accordance with some embodiments.

FIG. 5 shows an example data structure 500 (e.g., a look-up table) stored in accordance with operation 220 of FIG. 2. As shown in FIG. 5, the data structure 500 includes a set of different die temperatures 520 (e.g., Temperature 1, Temperature 2, Temperature 3, and Temperature 4). For each temperature 520, an optimized read voltage level is identified for each of the multiple different W2R delay times of the set of W2R delay times 510. In an embodiment, a slope value 530 is stored in association with each of the temperatures 520. For example, for temperature 4 (e.g., 85° C.), a set of optimized read voltage levels (e.g., optimized read voltage levels 1D, 2D, 3D, 4D, 5D, and 6D) are determined for each of the respective W2R delay times (e.g., W2R delay time 1 (e.g., 25 µs), W2R delay time 2 (e.g., 1 ms), W2R delay time 3 (e.g., 1 s), W2R delay time 4 (e.g. 1 min), W2R delay time 5 (e.g., 1 hr), and W2R delay time 6 (10 hrs)). As described above, each slope value (e.g., slope value 1, slope value 2, slope value 3, slope value 4, slope value 5, and slope value 6) represents a change of the optimized read voltage levels as a function of the W2R delay times (e.g., a change between optimized read voltage level 2D and optimized read voltage level 3D) for a given temperature (e.g., Temperature 4).

With reference to FIG. 2, in operation 220, in response to a read command, the processing logic determines a current write-to-read delay time and a current die temperature. In an embodiment, upon identification of a new read command, the processing logic measures a state of the current W2R delay time and die temperature. For example, in response to a read command, the processing logic can determine a first value corresponding to the W2R delay time and a second value corresponding to the die temperature. The current W2R delay time can be an amount of time that has elapsed since data was written to a unit of the memory sub-system until the new read command for the data stored at the unit of the memory sub-system has been received. The current die temperature can be the operating temperature of the die at the time that the read command was received.

In operation 230, the processing logic identifies, using the data structure, a stored slope value corresponding to the current die temperature. In an embodiment, a look-up operation is performed using the data structure of FIG. 5 to identify the slope value 530 corresponding to the current die temperature. In an embodiment, the stored slope value can be associated with a given memory die of the memory sub-system that is the subject of the read command. In some embodiments, a respective data structure can be generated and maintained for each of the memory die of the memory sub-system.

In operation 240, the processing logic determines an adjusted read voltage level based on the stored slope value and the current write-to-read delay time. In an embodiment, the adjusted read voltage level can be based on a default read voltage value adjusted as a function of the slope value and the W2R delay time. In an embodiment, the default read voltage value can be determined by measuring a read voltage value for a predetermined W2R delay time (e.g., a relatively short W2R delay time, such as 25 µs).

In an embodiment, the adjusted read voltage level can be determined in accordance with the following expression:

Adjusted read voltage level=Default read voltage level+[Stored Slope Value*log($W2R$ delay time)].

In operation 250, the processing logic executes the read command using the adjusted read voltage level. In an embodiment, the adjusted read voltage level is used in executing a read operation in response to the read command. Advantageously, applying the adjusted read voltage level accounts for threshold voltage drift caused by the then current die temperature of the memory sub-system and changes in the W2R delay times.

Figure 6:
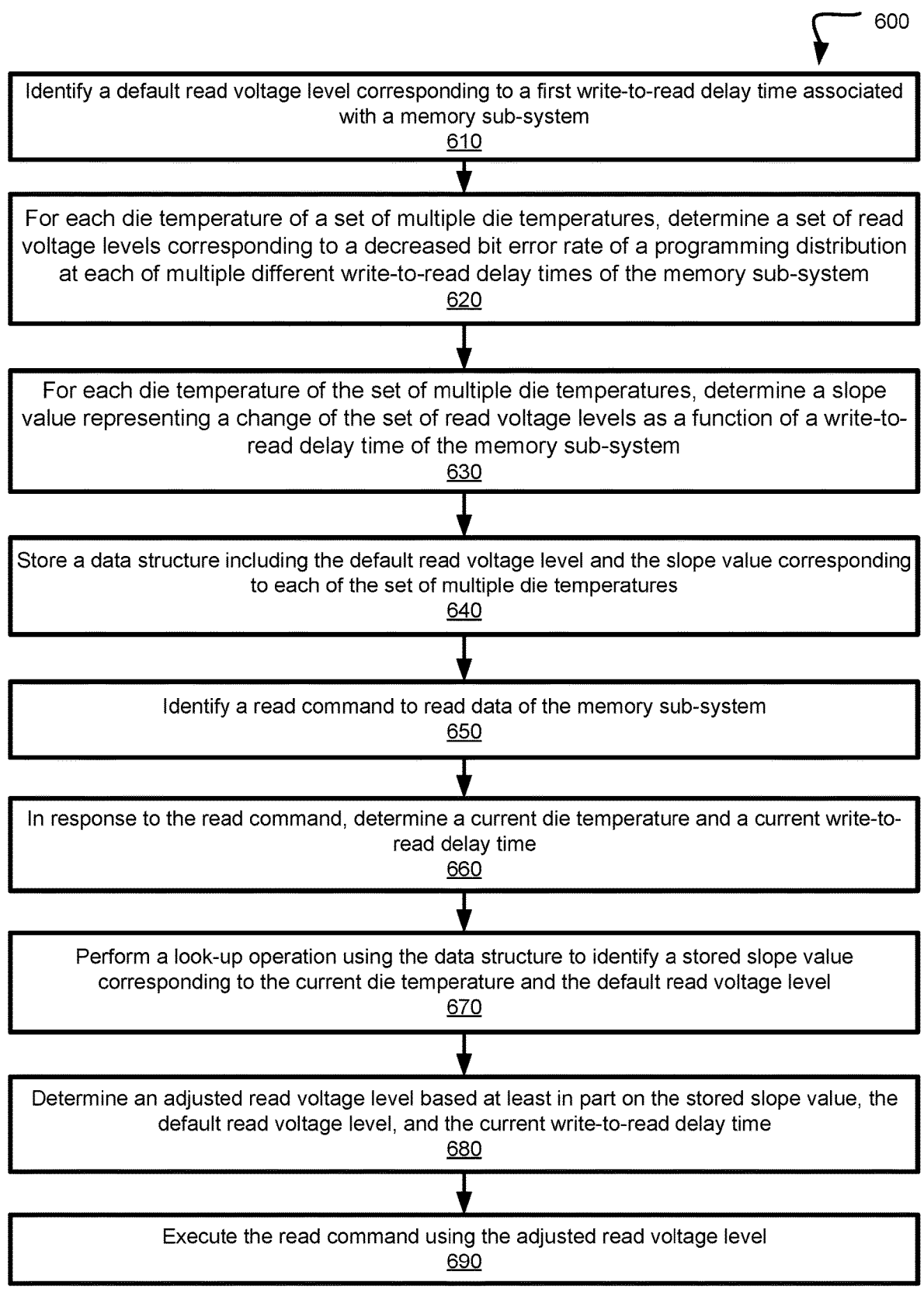
FIG. 6 is a flow diagram of an example method to execute a read command using an adjusted read voltage level in accordance with some embodiments.

FIG. 6 is a flow diagram of an example method 600 to execute a read command using an adjusted read voltage level to account for threshold voltage drift due to the die temperature and changes in W2R delay times in accordance with some embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the read voltage adjustment component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In operation 610, the processing logic identifies a default read voltage level corresponding to a default write-to-read delay time associated with a memory sub-system. In an embodiment, the default read voltage level can be determined by executing a probe at the default W2R delay time. In an embodiment, the default W2R delay time can be selected as a relative small or low W2R delay time, such as, for example, 25 µs. The read voltage level measured at the default W2R delay time can be set and stored as the default read voltage level.

In operation 620, for each die temperature of a set of multiple die temperatures, the processing logic determines a set of read voltage levels corresponding to a decreased bit error rate of a programming distribution at each of multiple different W2R delay times of the memory sub-system. In an embodiment, the set of read voltage levels corresponding to a decreased bit error rate (e.g., optimized read voltage levels) can be determined in accordance with the process described above in connection with FIGS. 3A and 3B. In an embodiment, each read voltage level of the set of read voltage levels is optimized by identifying a read voltage level that corresponds to decreased bit error rate (e.g., as shown in FIG. 3B). In an embodiment, the set of multiple die temperatures can include any suitable die temperatures including, for example, temperatures of 0° C., 25° C., 50° C., 85° C., or any similar values within a suitable range (e.g., 0° C. to 100° C.).

In operation 630, for each die temperature of the set of multiple die temperatures, the processing logic determines a slope value representing a change of the set of read voltage levels as a function of a write-to-read delay time of the memory sub-system. In an embodiment, a temperature-dependent slope value can be determined as a function of the delta of the read voltage levels and the w2r delay time, as described above and shown in the example of FIG. 4.

In operation 640, the processing logic stores a data structure including the default read voltage level and the slope value corresponding to each of the set of multiple die temperatures. In an embodiment, the data structure can include a look-up table stored in a memory associated with the memory sub-system (e.g., a fuse ROM memory).

In operation 650, the processing logic identifies a read command to read data of the memory sub-system. In an embodiment, the read command can be issued by a host system (e.g., host system 120 of FIG. 1) to read data from a memory die of the memory sub-system.

In operation 660, in response to the read command, the processing logic determines a current die temperature and a current W2R delay time. In an embodiment, the processing logic can maintain a timer that is reset to zero in response to the execution of a write operation. Then, in response to the read command, the processing logic can determine the amount of time that has elapsed since the resetting of the timer and record the elapsed time as the current W2R delay time. In an embodiment, the W2R delay time is a measurement of the time between a most recent write operation and a next read operation, as represented by the W2R timer.

In operation 670, the processing logic performs a look-up operation using the data structure to identify a stored slope value corresponding to the current die temperature. In an embodiment, in operation 670, the previously determined and stored temperature-dependent slope value is identified. In an embodiment, the processing logic can normalize the current temperature value to match one of the temperatures stored in the data structure (e.g., Temperature 1, Temperature 2, Temperature 3, or Temperature 4 of FIG. 5). In an embodiment, because the determined or measured current value of the temperature may not match the exact values used to establish the data structure, the values are normalized to match the table values. For example, the normalizing can include rounding the current temperature value down (or up) to a nearest stored value (e.g., a value of 0° C., 25° C., 50° C., or 85° C.) It is noted that any suitable normalizing process or technique can be applied to translate the determined current temperature value to a corresponding stored temperature value to enable the identification of a corresponding stored slope value.

In operation 680, the processing logic determines an adjusted read voltage level based at least in part on the stored slope value, the default read voltage level, and the current W2R delay time. As described above, in an embodiment, the adjusted read voltage level is determined by the following expression:

Adjusted read voltage level=Default read voltage level+[Stored Slope Value*log($W2R$ delay time)].

In an embodiment, the processing logic adjusts the default read voltage level in view of the temperature-dependent slope (e.g., the stored slope value) and W2R delay time to account for and counteract the threshold voltage drift due to temperature changes and W2R delay time changes.

In operation 690, the processing logic executes the read command using the adjusted read voltage level. Advantageously, dynamically adjusting the read voltage level to the adjusted optimized read voltage level reduces the associated bit error rate and counteracts the threshold voltage drift resulting from the current temperature and W2R delay time.

Figure 7:
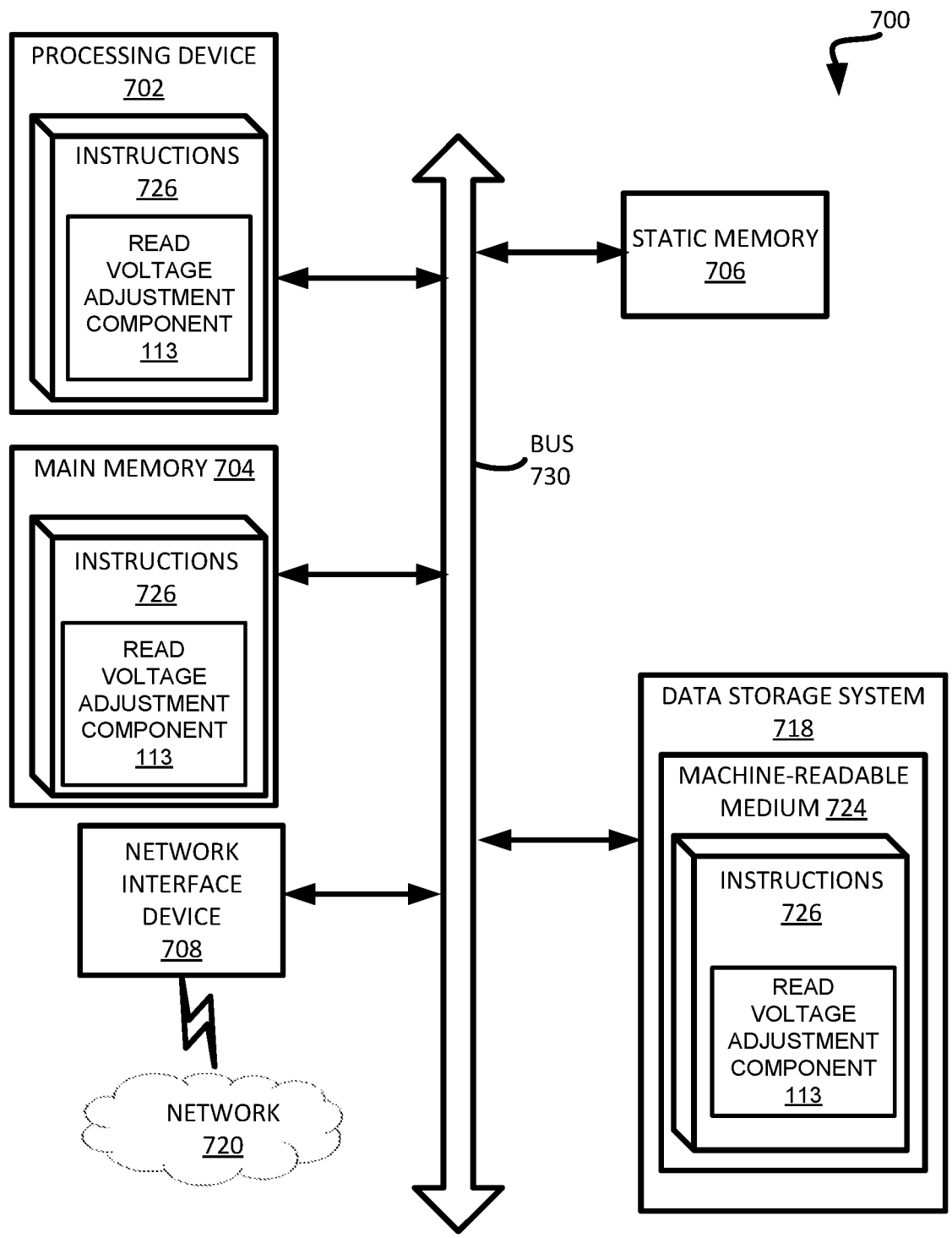
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to a read voltage adjustment component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a refresh operation component (e.g., the read voltage adjustment component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   storing a data structure comprising a slope value corresponding to each die temperature of a set of die temperatures, wherein the slope value represents a change of a read voltage level as a function of a delay time of a memory sub-system;
   identifying, using the data structure, a stored slope value corresponding to a measured die temperature;
   determining an adjusted read voltage level based on the stored slope value; and
   executing, by a processing device, a read command using the adjusted read voltage level.

2. The method of claim 1, wherein the delay time comprises a write-to-read delay time of the memory sub-system.

3. The method of claim 1, wherein the change of the read voltage level is based at least in part on a set of read voltage levels corresponding to a decreased bit error rate.

4. The method of claim 1, wherein the adjusted read voltage level is determined based in part on a default read voltage level corresponding to a first delay time of the memory sub-system.

5. The method of claim 1, further comprising:
   determining a second measured die temperature;
   identifying, using the data structure, a second stored slope value corresponding to the second measured die temperature;
   determining a second adjusted read voltage level based on the second stored slope value; and executing, by the processing device, a second read command using the second adjusted read voltage level.

6. The method of claim 1, further comprising:
in response to execution of a write operation, resetting a timer corresponding to a delay timer; and
in response to receipt of the read command, determining the delay time based on a value of the delay timer.

7. The method of claim 1, further comprising normalizing the measured die temperature to match one of a plurality of different die temperatures stored in the data structure.

8. A non-transitory computer readable medium comprising instructions, which when executed by a processing device, cause the processing device to perform operations comprising:
storing a data structure comprising a slope value corresponding to each die temperature of a set of die temperatures, wherein the slope value represents a change of a read voltage level as a function of a delay time of a memory sub-system;
identifying, using the data structure, a stored slope value corresponding to a measured die temperature;
determining an adjusted read voltage level based on the stored slope value; and
executing a read command using the adjusted read voltage level.

9. The non-transitory computer readable medium of claim 8, wherein the delay time comprises a write-to-read delay time of the memory sub-system.

10. The non-transitory computer readable medium of claim 8, wherein the change of the read voltage level is based at least in part on a set of read voltage levels corresponding to a decreased bit error rate.

11. The non-transitory computer readable medium of claim 8, wherein the adjusted read voltage level is determined based in part on a default read voltage level corresponding to a first delay time of the memory sub-system.

12. The non-transitory computer readable medium of claim 8, the operations further comprising:
determining a second measured die temperature;
identifying, using the data structure, a second stored slope value corresponding to the second measured die temperature;
determining a second adjusted read voltage level based on the second stored slope value; and
executing a second read command using the second adjusted read voltage level.

13. The non-transitory computer readable medium of claim 8, the operations further comprising:
in response to execution of a write operation, resetting a timer corresponding to a delay timer; and
in response to receipt of the read command, determining the delay time based on a value of the delay timer.

14. The non-transitory computer readable medium of claim 8, the operations further comprising normalizing the measured die temperature to match one of the set of die temperatures stored in the data structure.

15. A system comprising:
a memory component; and
a processing device, operatively coupled with the memory component, to perform operations comprising:
storing a data structure comprising a slope value corresponding to each die temperature of a set of die temperatures, wherein the slope value represents a change of a read voltage level as a function of a delay time of a memory sub-system;
identifying, using the data structure, a stored slope value corresponding to a measured die temperature;
determining an adjusted read voltage level based on the stored slope value; and
executing a read command using the adjusted read voltage level.

16. The system of claim 15, wherein the delay time comprises a write-to-read delay time of the memory sub-system.

17. The system of claim 15, wherein the change of the read voltage level is based at least in part on a set of read voltage levels corresponding to a decreased bit error rate.

18. The system of claim 15, wherein the adjusted read voltage level is determined based in part on a default read voltage level corresponding to a first delay time of the memory sub-system.

19. The system of claim 15, the operations further comprising:
determining a second measured die temperature;
identifying, using the data structure, a second stored slope value corresponding to the second measured die temperature;
determining a second adjusted read voltage level based on the second stored slope value; and
executing a second read command using the second adjusted read voltage level.

20. The system of claim 15, the operations further comprising:
in response to execution of a write operation, resetting a timer corresponding to a delay timer; and
in response to receipt of the read command, determining the delay time based on a value of the delay timer.

* * * * *